(12) United States Patent
Chang

(10) Patent No.: US 7,112,886 B2
(45) Date of Patent: Sep. 26, 2006

(54) PACKAGING STRUCTURE WITH A PLURALITY OF DRILL HOLES FORMED DIRECTLY BELOW AN UNDERFILL LAYER

(75) Inventor: Chu-Chia Chang, Hsin-Chu Hsien (TW)

(73) Assignee: PixArt Imaging Inc., Hsin-Chu Hsien (TW)

( * ) Notice: Subject to any disclaimer, the term of this patent is extended or adjusted under 35 U.S.C. 154(b) by 0 days.

(21) Appl. No.: 10/907,000

(22) Filed: Mar. 15, 2005

(65) Prior Publication Data

US 2006/0118964 A1   Jun. 8, 2006

(30) Foreign Application Priority Data

Dec. 6, 2004   (TW) .............................. 93219624 U

(51) Int. Cl.
*H01L 23/48* (2006.01)
*H01L 23/52* (2006.01)

(52) U.S. Cl. .............................. 257/774; 257/E23.002; 257/E23.011

(58) Field of Classification Search ................ 257/774
See application file for complete search history.

(56) References Cited

U.S. PATENT DOCUMENTS

2003/0201507 A1* 10/2003 Chen et al. ................. 257/433

* cited by examiner

*Primary Examiner*—Andy Huynh
*Assistant Examiner*—Earl Taylor
(74) *Attorney, Agent, or Firm*—Winston Hsu

(57) ABSTRACT

A packaging structure for an optical sensor with drill holes formed directly below an underfill layer includes a substrate having a plurality of drill holes, a plurality of vias, a plurality of traces, a plurality of gold wires, an underfill layer, a die having a plurality of bonding pads, and a container for isolating the die from the ambient atmosphere. The plurality of vias are formed within the plurality of drill holes and the plurality of bonding fingers are formed on the substrate. The plurality of traces formed on the substrate couple the plurality of bonding fingers to the plurality of vias. The plurality of gold wires couple the plurality of bonding pads to the plurality of bonding fingers. The underfill layer is formed between the die and the substrate for die attachment, wherein the plurality of the drill holes are formed below the underfill layer.

12 Claims, 7 Drawing Sheets ically, to a packaging structure for an optional
PACKAGING STRUCTURE WITH A PLURALITY OF DRILL HOLES FORMED DIRECTLY BELOW AN UNDERFILL LAYER

BACKGROUND OF INVENTION

1. Field of the Invention

The present invention relates to a packaging structure, and more particularly, to a packaging structure for an optical sensor.

2. Description of the Prior Art

The packaging of an integrated circuit (IC) is to provide connections between the die, the packaging structure and the circuit board. The IC packaging also provides a suitable operating environment for the IC's operation. The main purposes of the IC packaging are:

(1) power transmission;
(2) signal transmission, including the external signals and the internal electronic signals;
(3) heat dissipation, including structural and material heat dissipation;
(4) circuit protection.

In addition to the above-mentioned purposes, manufacturing costs and stability of an IC package also need to be taken into considerations.

To achieve the purpose of signal transmission in a packaging design for an optical sensor, a substrate with drill holes is used in a packaging method called leadless chip carrier (LCC), as illustrated in FIG. 1. FIG. 1 is a diagram of a prior art packaging structure 100. In other common packaging methods, such as dual-in-line package (DIP) or small outline package (SOP), the pins are formed along the two sides of the die. Unlike those methods, in the LCC technology the pins are formed around the four sides of the die. Therefore the LCC technology offers more pins than DIP and SOP, usually ranging from 20 to 96 pins. To accommodate this four-sided pin layout, in the LCC technology a special substrate with drill holes formed at the four sides of the substrate is required, as illustrated in FIG. 1. These drill holes result in a substrate material usage lower than 70%, with the result that the substrate cost contributes a large part of the overall packaging cost.

Another common packaging method is called land grid array (LGA), as illustrated in FIG. 2. FIG. 2 is a diagram of another prior art packaging structure 200. In the packaging structure 200, a die 20 is coupled to a plurality of bonding fingers 14 by a plurality of gold wires 18 in a die bond process. A plurality of traces 16 are disposed on a substrate 12, coupling the bonding fingers 14 to a circuit board 24 through a plurality of vias 26 formed within a plurality of drill holes 210 for transmitting signals. In the LGA technology in FIG. 2, the plurality of drill holes 210 are made in the inner part of the substrate 12. Based on different chip designs and pin layouts, there are many types of substrates with drill holes formed in their inner parts available.

The packaging structure 100 and the packaging structure have one thing in common; that is, both packaging structures include a cavity structure 34. The packaging process of an optical sensor includes a sealing process, which is performed at an elevated temperature and which thus produces moisture. To prevent the moisture from entering the cavity structure 34 through the drill holes during the sealing process and the reliability tests, another "plug-in" process has to be included in producing the prior art packaging structures 100 and 200, which thus increases the manufacturing cost.

SUMMARY OF INVENTION

It is therefore an objective of the claimed invention to provide a packaging structure for an optical sensor in order to solve the problems in the prior art.

The claimed invention discloses a packaging structure with a plurality of drill holes formed directly below an underfill layer, the packaging structure comprising a substrate having a plurality of drill holes, a plurality of vias formed within the plurality of drill holes, a plurality of bonding fingers formed on the substrate, a plurality of traces formed on the substrate for coupling the plurality of bonding fingers to the plurality of vias, at least one die disposed on the substrate, the die having a plurality of bonding pads, a plurality of gold wires for coupling the plurality of bonding pads of the die and the plurality of bonding fingers of the substrate, an underfill layer formed between the die and the substrate, wherein the plurality of drill holes are formed below the underfill layer, and a container for isolating the die from the ambient atmosphere.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
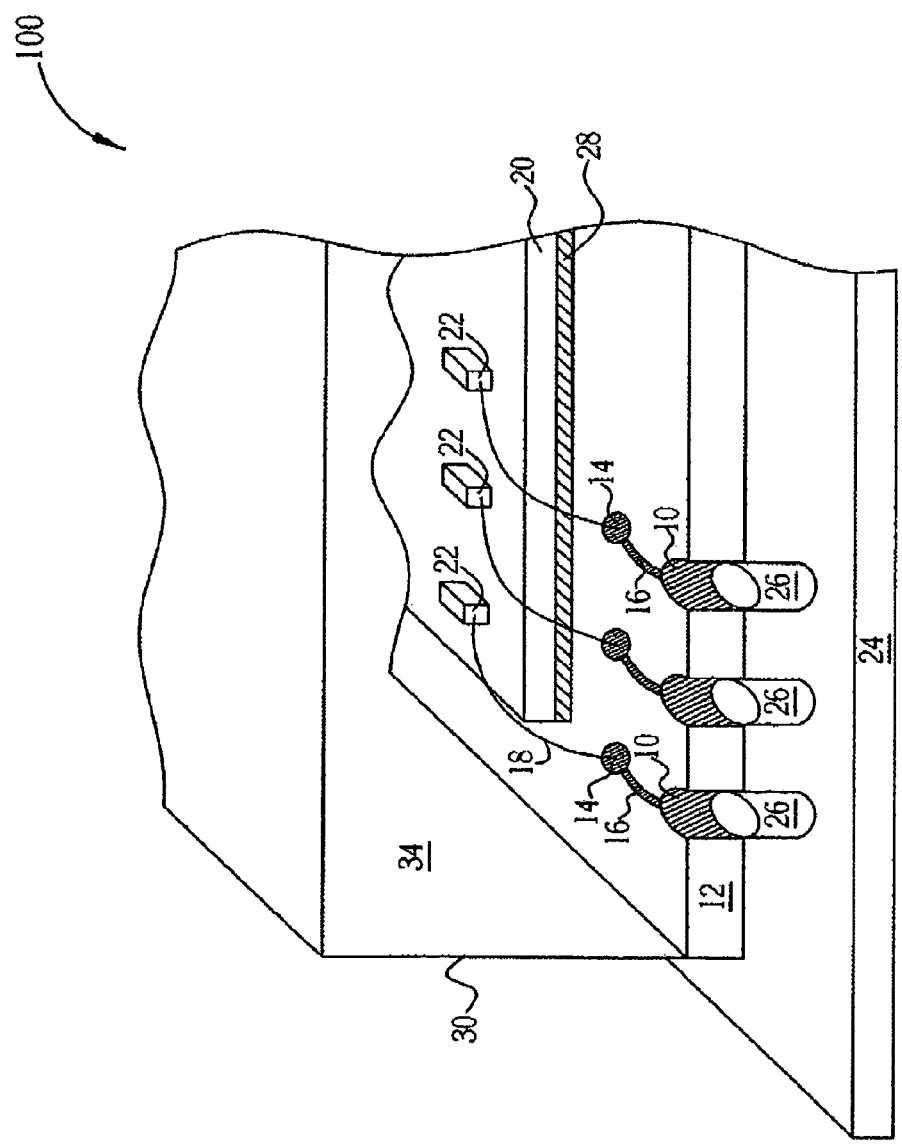
FIG. 1 is a diagram of a prior art packaging structure.
Figure 2:
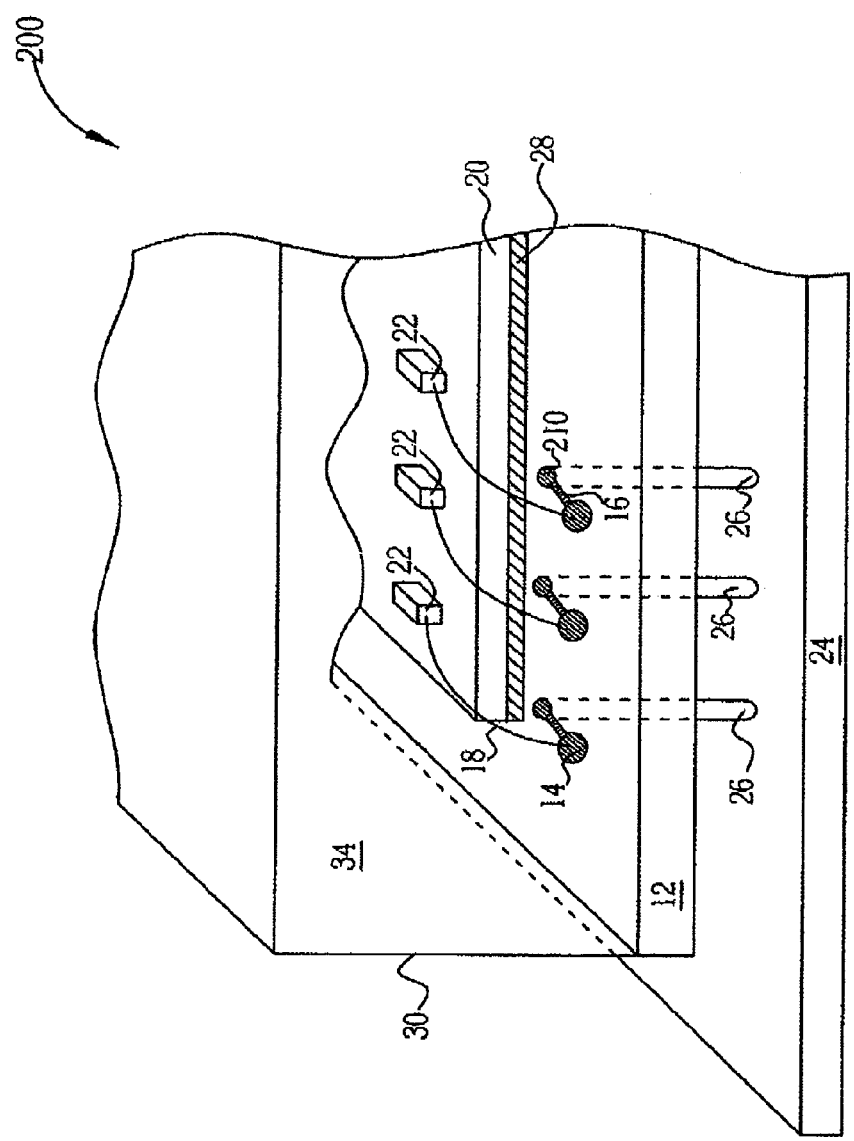
FIG. 2 is a diagram of another prior art packaging structure.
Figure 3:
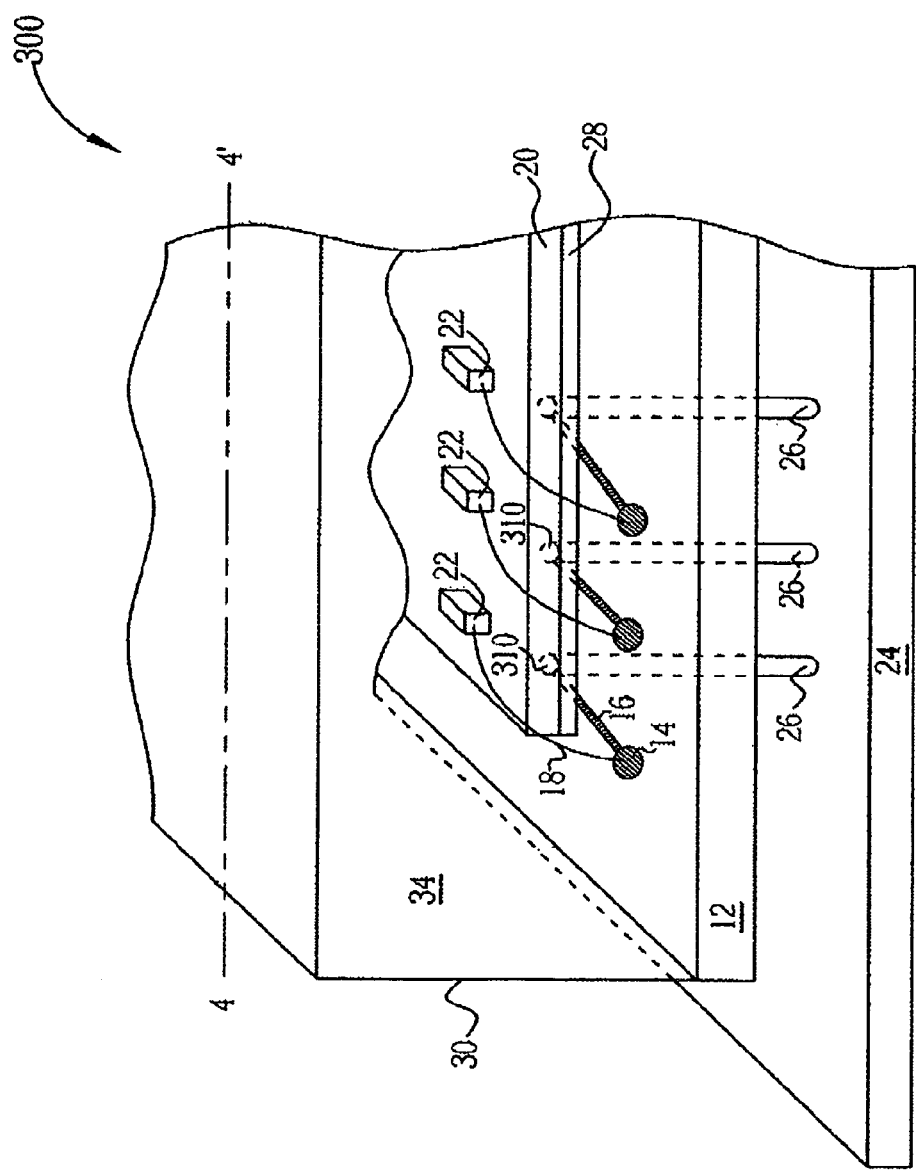
FIG. 3 is a diagram of a packaging structure according to the present invention.

Please refer to FIG. 3 for a packaging structure 300 of the present invention. The packaging structure 300, disposed on a circuit board 24, includes a substrate 12, a die 20 and a container 30. The substrate 12 has a plurality of drill holes 310. A plurality of vias 26 are formed within the plurality of drill holes 310. A plurality of bonding fingers 14 and a plurality of traces 16 are formed on the substrate 12 for coupling the bonding fingers 14 to the plurality of vias 26. The die 20, disposed on the substrate 12, has a plurality of bonding pads 22. A plurality of gold wires 18 couple the plurality of bonding pads 22 of the die 20 to the plurality of bonding fingers 14 of the substrate 12. An underfill layer 28 is formed between the die 20 and the substrate 12 for attaching the die 20 to the substrate 12. The container 30 having a transparent portion is disposed on the substrate 12 for isolating the die 20 from the ambient environment. In the packaging structure 300 of the present invention, all of the drill holes 310 are formed under the underfill layer 28. The die 20 can be an optical sensor. The circuit board 24 can be a printed circuit board. The transparent portion of the container 30 can include glass, plastic, or other light-transparent materials. The underfill layer can include epoxy.

Figure 4:
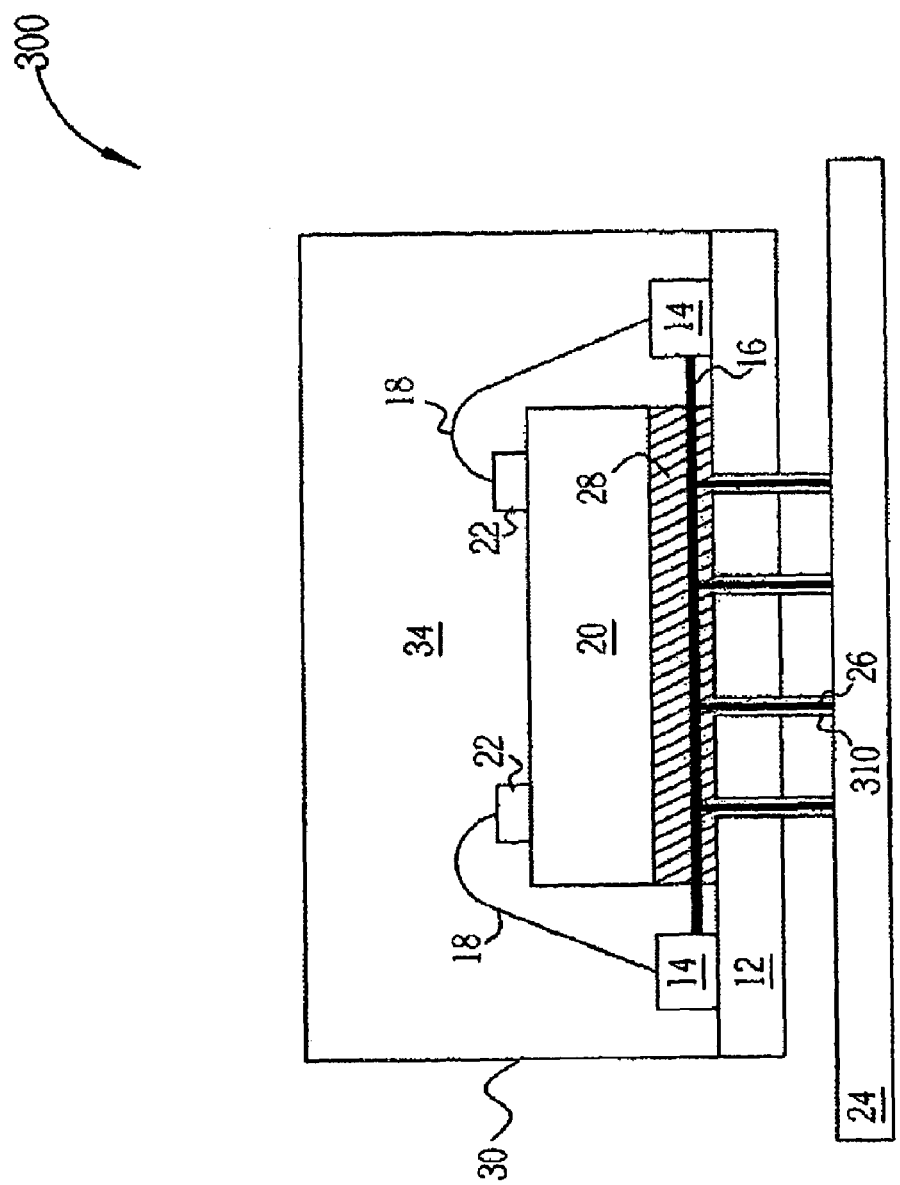
FIG. 4 is a cross-sectional view of the packaging structure in FIG. 3 along line 4–4'.

Please refer to FIG. 4 for a cross-sectional view of the packaging structure 300 along line 4-4' in FIG. 3. In the packaging structure 300 all the drill holes 300 are located under the underfill layer 28. Thus, after the die bond process, the underfill layer 28 for attaching the die 20 to the substrate 12 naturally prevents the moisture from entering the cavity structure 34 through the drill holes 310. In the packaging structure 300, the underfill layer 28 and the die 20 cover the same region of the substrate 12, and equivalently speaking, the drill holes 310 are located under the die 20. However, the present invention is not limited to the packaging design of putting all the drill holes under the die 20. When it is not possible to put all the drill holes 310 under the underfill layer 28 due to too many drill holes or other design reasons, the prevent invention also includes further extending the underfill layer 28 to a range larger than that covered by the die 20. This way, although not all of the drill holes 310 are located under the die 20, all the drill holes 310 are still located under the underfill layer 28. The underfill layer 28 can still prevent the moisture from entering the cavity structure 34 through the drill holes 310. Therefore the present invention includes all packaging structures with the design of putting all the drill holes under an underfill layer.

Figure 5:
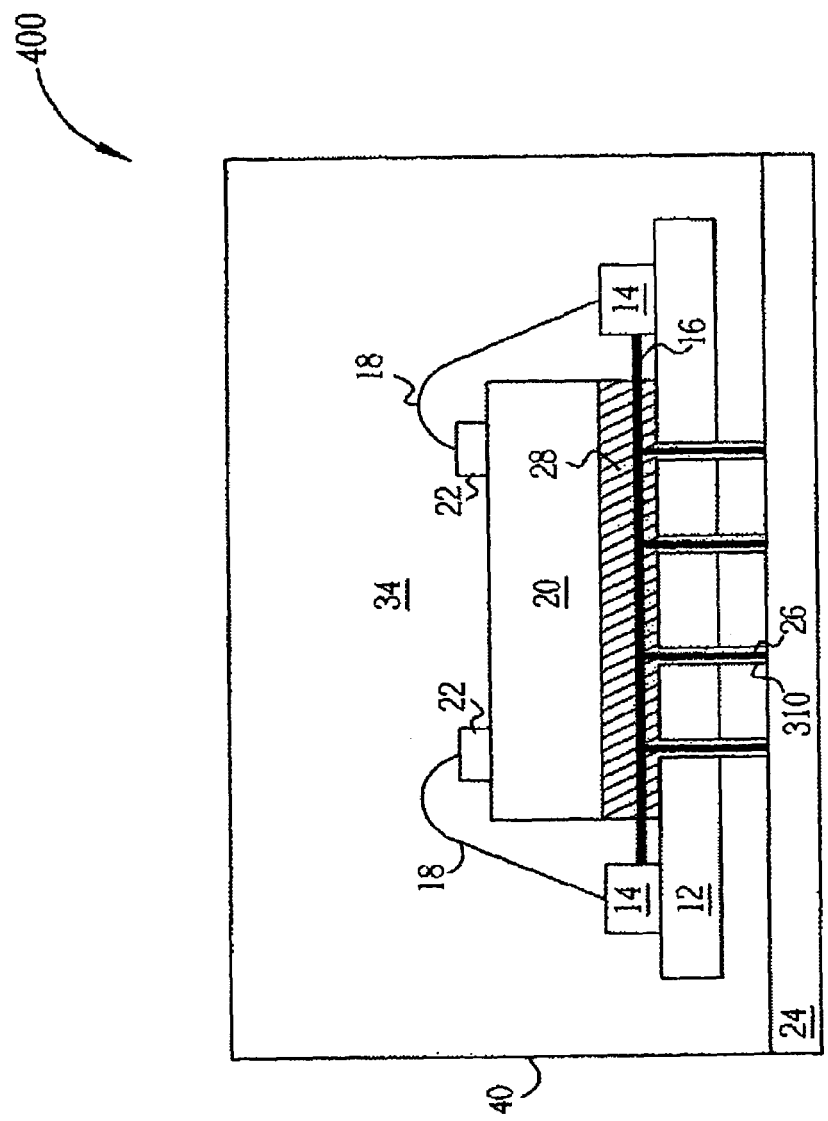
FIG. 5 is a cross-sectional view of another packaging structure according to the present invention.

Please refer to FIG. 5 for a cross-sectional view of another packaging structure 400 according to the present invention. In the packaging structure 400, all of the drill holes 310 are located under the underfill layer 28. The packaging structure 400 differs from the packaging structure 300 in that a container 40 is disposed on the circuit board 24 instead of on the substrate 12.

Figure 6:
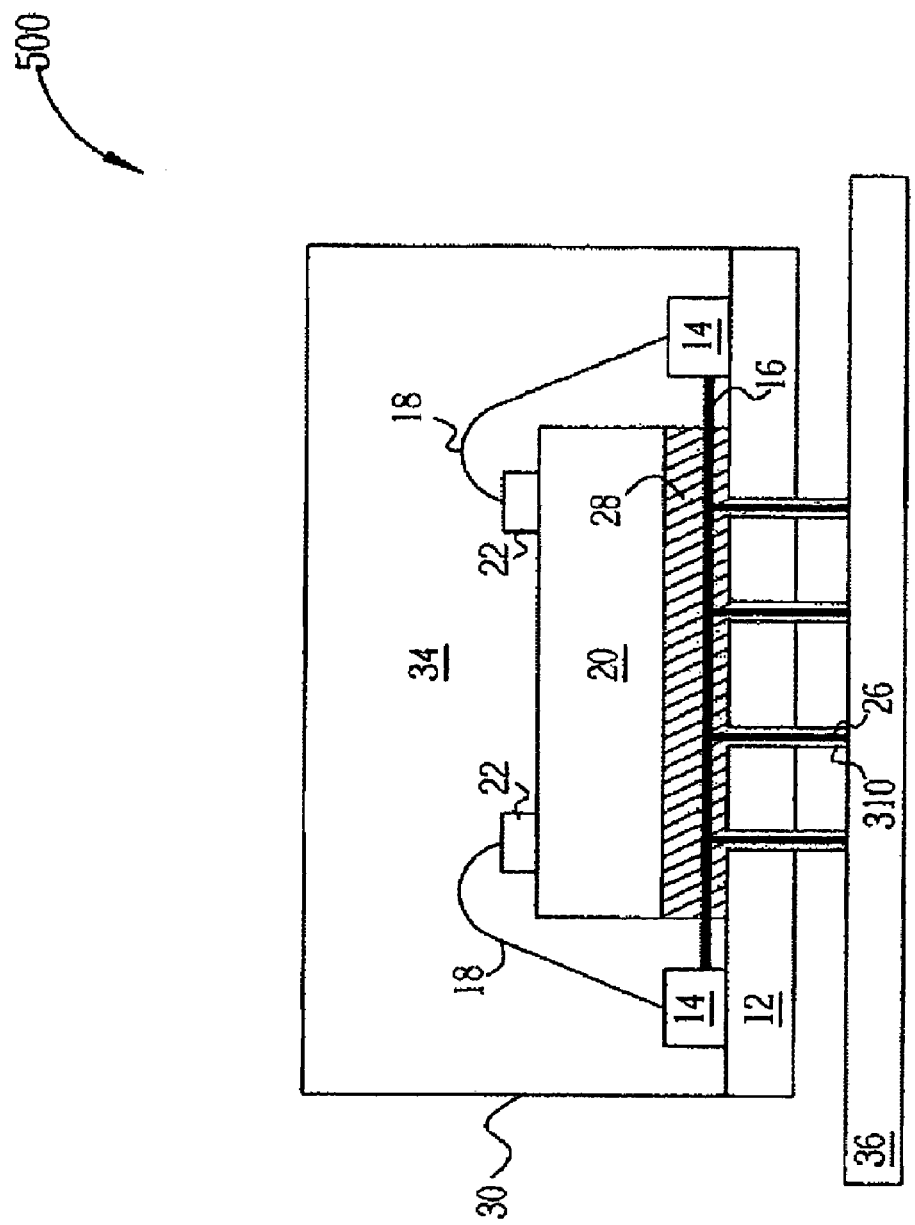
FIG. 6 is a cross-sectional view of another packaging structure according to the present invention.

Please refer to FIG. 6 for a cross-sectional view of another packaging structure 500 according to the present invention. In the packaging structure 500, all of the drill holes 310 are located under the underfill layer 28. The packaging structure 500 differs from the packaging structure 300 in that the packaging structure 500 is disposed on a socket 36 instead of on the circuit board 24.

Figure 7:
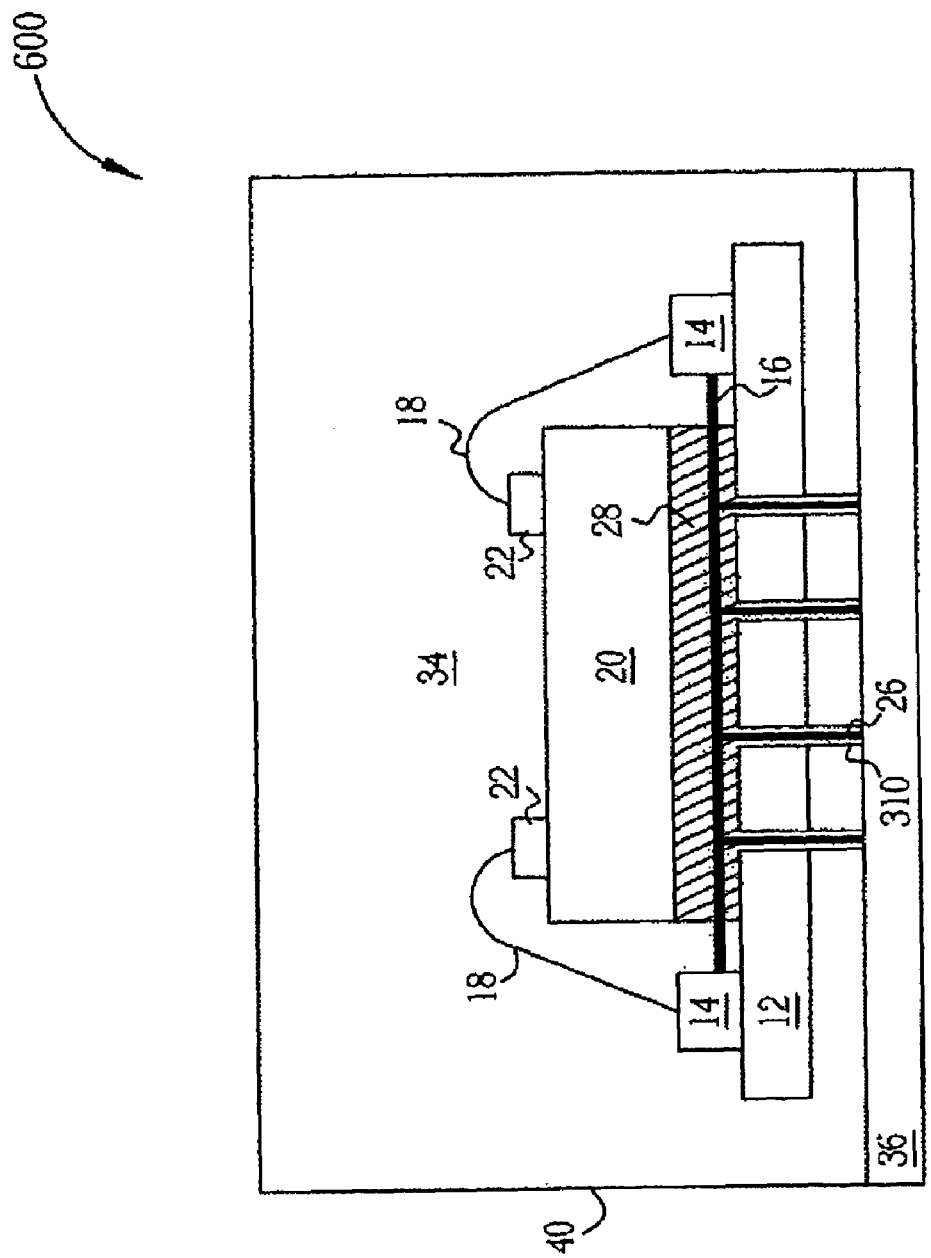
FIG. 7 is a cross-sectional view of another packaging structure according to the present invention.

Please refer to FIG. 7 for a cross-sectional view of another packaging structure 600 according to the present invention. In the packaging structure 600, all of the drill holes 310 are located under the underfill layer 28. The packaging structure 600 differs from the packaging structure 300 in that the container 40 is disposed on the socket 36 instead of on the substrate 12.

Since in the packaging structures 300, 400, 500 and 600 all of the drill holes 310 are formed under the underfill layer 28, the underfill layer 28, used for attaching a die, can prevent the moisture from entering the cavity structure 34 of these packaging structures.

Compared to the prior art packaging structures, the present invention provides a packaging structure with drill holes formed directly below an underfill layer. This way the underfill layer used for die attachment can prevent the moisture from entering the cavity structure. The present invention includes the same function of the prior art "plug-in" process without adding a new process in the production flow, and thus achieves cost reduction for the substrate material and the "plug-in" process. Also the present invention offers better heat dissipation for the packaging structure. Since all or most of the drill holes are formed below the die, the heat produced by an operating chip will be transmitted directly to the substrate through the drill holes. Therefore the present invention has lower thermal resistance than the prior art.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A packaging structure with a plurality of drill holes only formed directly below an underfill layer, the packaging structure comprising:
   a substrate having a plurality of drill holes;
   a plurality of vias formed within the plurality of drill holes;
   a plurality of bonding fingers formed on the substrate;
   a plurality of traces formed on the substrate for coupling the plurality of bonding fingers to the plurality of vias;
   at least one die disposed on the substrate, the die having a plurality of bonding pads;
   a plurality of gold wires for coupling the plurality of bonding pads to the plurality of bonding fingers;
   an underfill layer formed between the die and the substrate, wherein all of the drill holes are formed below the underfill layer and covered by the underfill layer; and
   a container for isolating the die from the ambient atmosphere.

2. The packaging structure of claim 1 wherein the packaging structure is disposed on a circuit board.

3. The packaging structure of claim 2 wherein the container is disposed on the circuit board.

4. The packaging structure of claim 2 wherein the circuit board is a printed circuit board.

5. The packaging structure of claim 1 wherein the packaging structure is disposed on a socket.

6. The packaging structure of claim 5 wherein the container is disposed on the socket.

7. The packaging structure of claim 1 wherein die underfill layer comprises epoxy.

8. The packaging structure of claim 1 wherein the container comprises a transparent portion.

9. The packaging structure of claim 8 wherein the transparent portion of the container is made of glass or plastic.

10. The packaging structure of claim 1 wherein one end of each one of the plurality of drill holes is in contact with the underfill layer.

11. The packaging structure of claim 1 wherein the die comprises an optical sensor.

12. The packaging structure of claim 1 wherein the packaging structure comprises a cavity structure.

* * * * *